United States Patent [19]

Miller et al.

[11] Patent Number: 5,914,217
[45] Date of Patent: Jun. 22, 1999

[54] ALKALINE DEVELOPING COMPOSITION AND METHOD OF USE TO PROCESS LITHOGRAPHIC PRINTING PLATES

[75] Inventors: Gary Roger Miller, Ft. Collins; Melanie Ann Felker, Loveland, both of Colo.

[73] Assignee: Kodak Polychrome Graphics LLC, Norwalk, Conn.

[21] Appl. No.: 09/162,944

[22] Filed: Sep. 29, 1998

Related U.S. Application Data

[62] Division of application No. 08/904,092, Jul. 31, 1997, which is a division of application No. 08/729,471, Oct. 11, 1996, Pat. No. 5,766,826.

[51] Int. Cl.$^6$ .................................................. G03C 7/32
[52] U.S. Cl. ........................ 430/302; 430/322; 430/331
[58] Field of Search ..................................... 430/302, 322, 430/331

[56] References Cited

U.S. PATENT DOCUMENTS

| | | | |
|---|---|---|---|
| 3,615,480 | 10/1971 | Lam | 430/331 |
| 3,650,745 | 3/1972 | Hackmann et al. | 430/322 |
| 4,116,851 | 9/1978 | Rupe et al. | 510/197 |
| 4,259,434 | 3/1981 | Yamasue et al. | 430/302 |
| 4,451,393 | 5/1984 | Watanabe et al. | 510/197 |
| 4,452,731 | 6/1984 | Watanabe et al. | 510/197 |
| 4,452,880 | 6/1984 | Seino et al. | 430/309 |
| 4,469,776 | 9/1984 | Matsumoto et al. | 430/309 |
| 4,576,903 | 3/1986 | Baron et al. | 430/331 |
| 4,592,992 | 6/1986 | Hsieh et al. | 430/309 |
| 4,643,840 | 2/1987 | Brocklehurst et al. | 510/207 |
| 4,822,723 | 4/1989 | Dhillon | 430/331 |
| 4,945,030 | 7/1990 | Turner et al. | 430/331 |
| 5,076,952 | 12/1991 | Ahmed et al. | 510/221 |
| 5,164,286 | 11/1992 | Blakeney et al. | 430/331 |
| 5,168,032 | 12/1992 | Okamoto et al. | 430/281 |
| 5,229,027 | 7/1993 | Ahmed | 510/221 |
| 5,234,796 | 8/1993 | Shimura et al. | 430/331 |
| 5,250,393 | 10/1993 | Imai et al. | 430/302 |
| 5,380,623 | 1/1995 | Miller et al. | 430/309 |
| 5,462,689 | 10/1995 | Choy et al. | 510/195 |
| 5,480,762 | 1/1996 | Toyama et al. | 430/302 |
| 5,565,419 | 10/1996 | Thomas et al. | 510/219 |

FOREIGN PATENT DOCUMENTS

| | | |
|---|---|---|
| 97282 | 1/1984 | European Pat. Off. . |
| 323836 | 1/1988 | European Pat. Off. . |
| 274044 | 7/1988 | European Pat. Off. . |
| 323836 | 7/1989 | European Pat. Off. . |
| 19520741 | 6/1994 | Germany . |
| 61-215554 | 9/1986 | Japan . |
| 1-287561 | 5/1988 | Japan . |
| 1-056442 | 3/1989 | Japan . |
| 3-228054 | 10/1991 | Japan . |
| 6-282079 | 10/1994 | Japan . |
| 2060923 | 9/1979 | United Kingdom . |

*Primary Examiner*—Hoa Van Le
*Attorney, Agent, or Firm*—Ratner & Prestia

[57] ABSTRACT

An alkaline developing composition for processing a lithographic printing plate includes an alkali metal silicate and at least 6 weight % of a thickener such as glycerine. The lithographic printing plate can be either positive- or negative-working, and includes negative-working thermal plates.

15 Claims, No Drawings

ALKALINE DEVELOPING COMPOSITION AND METHOD OF USE TO PROCESS LITHOGRAPHIC PRINTING PLATES

CROSS-REFERENCE TO RELATED APPLICATIONS

This application is a division of allowed U.S. Ser. No. 08/904,092, filed on Jul. 31, 1997, which is a division of U.S. Ser. No. 08/792,471, filed on Oct. 11, 1996, now U.S. Pat. No. 5,766,826, entitled "ALKALINE DEVELOPING COMPOSITION AND METHOD OF USE TO PROCESS LITHOGRAPHIC PRINTING PLATES."

FIELD OF THE INVENTION

This invention relates in general to lithography and in particular to aqueous alkaline developing compositions useful for developing either positive-working or negative-working lithographic printing plates. It also relates to a method of using this developing composition to process imagewise exposed printing plates.

BACKGROUND OF THE INVENTION

The art of lithographic printing is based upon the immiscibility of oil and water, wherein the oily material or ink is preferentially retained by the image areas and the water or fountain solution is preferentially retained by the non-image areas of the printing plate. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and plastics. Commonly, the ink is transferred to an intermediate material called the blanket which in turn transfers the ink to the surface of the material upon which the image is to be reproduced.

Lithographic printing plates can be either negative-working or positive-working, and comprise one or more photosensitive layers on a suitable substrate, such as a metal or polymeric support. The photosensitive layer generally includes one or more photosensitive components that may be dispersed in a suitable binder. Alternatively, the photosensitive component can also be the binder material. Certain useful printing plates can be used either as positive-working or negative-working.

A negative-working printing plate generally has a light sensitive layer composed of a photosensitive component such as an unsaturated resin on a suitable substrate. Upon exposure to light, the exposed areas are hardened, leaving non-exposed areas removable during development. The exposed, hardened areas are therefore oleophilic and will accept ink while the non-exposed underlying areas of the substrate are hydrophilic.

A positive-working printing plate generally has a light sensitive layer composed of a photosensitive component such as an o-diazoquinone or diazonaphthoquinone compound. Upon exposure to light the photosensitive component is converted to the corresponding carboxylic acid. The use of an alkaline developer will remove only the exposed areas of the photosensitive layer, leaving the surface of the support. Since the surface of the support is hydrophilic, the uncovered non-image area attracts water and repels the oily ink. The image area remaining after development is oleophilic thereby repelling water and attracting the printing ink.

Various aqueous solutions are known for use as developers for both positive-working and negative-working printing plates. It is known to use a dispersion of a silicate to develop positive-working printing plates, as described, for example, in U.S. Pat. No. 4,259,434 (Yamasue et al). These solutions include alkali metal silicates, in which the ratio of $SiO_2$ to M is from 0.5 to 0.75 ("M" being the alkali metal) at about 1–4% $SiO_2$ concentration. However, many of such developers are overly active and attack or remove the unexposed image on the plates. The replenishment rate of such developers is critical because the operational range of the developers is very narrow.

U.S. Pat. No. 4,452,880 (Seino et al) describes silicate-containing developers wherein the $SiO_2$ to alkali metal oxide ratios are much higher, that is between 1.6 and 2.0, and the % $SiO_2$ concentration is from about 2 to about 9%. These developers have relatively low activity, resulting in slow or incomplete development within the time necessary for practical commercial use. Thus, higher amounts of silicate must be included. Such higher amounts can be disadvantageous due to cost, residue on the plates and the potential for clogging processing equipment.

It would be desirable to have a single developer solution that can be used for either positive-working or negative-working printing plates. Such a developer should have suitable activity (not too low or too high) within the desired processing time, and lower replenishment rates. Moreover, if replenishment is done, the replenisher should have the same composition as the developer.

SUMMARY OF THE INVENTION

The problems noted above have been solved with the use of an alkaline developing composition that is useful in developing either positive-working or negative-working lithographic printing plates, the composition having a pH of at least about 12 and comprising:

a) an alkali metal silicate, and b) at least 6 weight W of a water-soluble or water-dispersible thickener.

This alkaline developing composition can be used in a processing method for developing an imagewise exposed positive-working or negative-working lithographic printing plate as described in more detail below. In addition, the composition can also be used to develop both positive-working plates and negative-working thermal plates (that is, those exposed to heat for hardening exposed regions). These advantages allow the user to install only one machine for processing both types of plates.

This developing composition has just the desired activity for extended usefulness. It is not too active or too slow in development, and is less corrosive. Thus, the action of the developing composition at the beginning of its use is not overly aggressive, and it retains suitable activity until it is discarded. Importantly, it has a prolonged usefulness as a processing solution. Thus, the user can obtain more consistent photographic speed and image quality throughout the time the developing composition is used.

The developing composition provides greater processing latitude than conventional solutions. Moreover, it can be used as its own replenisher, thus eliminating the need for specially formulated replenishing solutions of higher activity to maintain the useful life of the processing bath. When used as a replenishing solution, the replenishment rate of the composition of this invention is generally lower than that used with compositions lacking a thickener.

The advantages of this invention are provided by including within the developing composition at least 6 weight % of a water-soluble or water-dispersible thickener. Useful thickeners are described in more detail below. In preferred embodiments, the amount of alkali metal silicate in the composition is also kept within certain amounts as described in more detail below. Thus, the ratio of $SiO_2/M_2O$ (wherein "M" is alkali metal) may also be important to optimize the advantages described above.

DETAILED DESCRIPTION OF THE INVENTION

As noted above, the aqueous alkaline developing compositions of this invention include water and at least one alkali metal silicate, such as a lithium, sodium and potassium silicate. Sodium and potassium silicates are preferred and potassium silicate is most preferred. A mixture of alkali metal silicates can be used if desired.

Especially preferred developing compositions contain an alkali metal silicate having a $Si_2O$ to $M_2O$ weight ratio of at least 0.3 wherein "M" is the alkali metal (such as potassium). Preferably, this ratio is from about 0.3 to about 1.1. More preferably, it is from about 0.4 to about 1.0, and most preferably, it is from about 0.7 to 1.0.

The amount of alkali metal silicate in the developing composition is generally at least about 20 grams $SiO_2$ per 1000 grams of composition, and preferably from about 30 to about 80 grams $SiO_2/1000$ grams of composition. Most preferably, it is from about 40 to about 60 g $SiO_2/1000$ g of developing composition. Various commercial sources of silicates are known.

The developing composition has an alkaline pH that is generally at least about 12, and preferably from about 12 to about 14. In addition to the alkali silicate, alkalinity can be provided using a suitable concentration of any suitable chemical base, such as a hydroxide (for example, ammonium hydroxide, sodium hydroxide, lithium hydroxide and potassium hydroxide).

Useful thickeners for the developing compositions of this invention are water-soluble or water-dispersible polyhydroxy compounds. Representative compounds include, but are not limited to, glycerine (or glycerol), polyethylene glycol, polypropylene glycol and other similar materials having a plurality of hydroxy groups, that would be readily apparent to one skilled in the art in view of the teaching herein. The particular thickener that will provide the desired performance may depend upon its concentration, the amount of chemical base or silicates used, and the type of plate being processed. Thus, some routine experimentation may be needed to find the optimum levels of a given thickener for a given type of printing plate. Some thickeners may provide advantageous results only with positive-working plates, while others do the same for negative-working plates only. More preferably, the thickeners are useful universally, that is, with positive-working plates or negative-working thermal plates over the entire disclosed concentration range. Thickeners that provide these unexpected universal processing properties include non-polymeric thickeners such as glycerine. A mixture of thickeners can be used if desired.

The amount of thickener used in the developing composition is at least 6 weight %, and an amount of from 6 to about 30 weight % is preferred. More preferably, the thickener is present in an amount of from about 7.5 to about 18 weight %. The amount of thickener used in a given developing composition may vary depending upon the type of printing plate being processed and the type of photosensitive materials in the printing plate. For example, the optimal amount of thickener useful for processing positive-working plates may be different than the optimal amount of thickener useful for processing negative-working thermal plates. A skilled worker in the art would be able to determine the useful amounts for a given type of printing plate and photosensitive material using routine experimentation. A most preferred composition of this invention includes glycerine at a concentration of from about 8 to about 12 weight %.

Optional components of the developing composition include one or more surfactants (anionic, nonionic and amphoteric) in a suitable amount (for example, up to 3% based on total composition weight) or a biocide (antimicrobial or antifungal agent). One or more anti-foaming agents can also be included in the composition. Chelating agents, such as alkali gluconates, may also be included. However, in preferred embodiments, neither a surfactant, anti-foaming agent nor a chelating agent is included in the composition.

In one embodiment, a positive-working printing plate is imagewise exposed using a suitable light source, turning the exposed regions alkali soluble. Accordingly, the exposed regions are washed away with the alkaline developing composition of this invention to reveal the hydrophilic substrate underneath.

Development of a positive-working printing plate according to this invention is generally conducted at a temperature of from about 18 to about 28° C. for a period of from about 5 to about 60 seconds.

The positive-working printing plates processed in the practice of this invention are any of those conventionally used in the art. They typically include a metal or polymeric substrate, which is preferably an aluminum, aluminum alloy or treated aluminum substrate. Such substrates are well known in the art, e.g., as described in U.S. Pat. No. 4,259,434 (noted above), U.S. Pat. No. 5,122,243 (Hall) and U.S. Pat. No. 5,368,974 (Walls et al).

On the substrate is an appropriate positive-working photosensitive layer that includes a photosensitive component such as an o-diazoquinone, including an o-diazonaphthoquinone compound as described in U.S. Pat. No. 4,927,741 (Garth et al) and GB-2,082,339 (published Mar. 3, 1982).

Although these photosensitive compounds can be used alone, more typically they are dispersed in a suitable binder material (or mixture thereof) that is soluble in the alkaline developing composition. Such binder materials include, but are not limited to, novolac-type phenolic resins, and others readily apparent to one skilled in the art. Further additives can be included in the photosensitive layer composition, including dyes, plasticizers, and components that give print-out properties.

In another embodiment of this invention, a negative-working printing plate is imagewise exposed using a suitable light source, hardening the exposed regions. Accordingly, the non-exposed regions are washed away with the alkaline developing composition of this invention to reveal the hydrophilic substrate underneath. Especially useful are negative-working thermal plates that also contain an infrared radiation absorbing compound, rendering the photosensitive layer infrared radiation (or heat) sensitive. Thus, a laser or other source of infrared radiation can be used to reduce solubility in exposed regions of the plate. A variety of materials are known for such plates, as described for example, in U.S. Pat. No. 5,340,699 (Haley et al), U.S. Pat. No. 5,466,557 (Haley et al) and U.S. Pat. No. 5,491,046 (DeBoer et al).

Development of a negative-working printing plate according to this invention is generally conducted at a temperature of from about 18 to about 28° C. for a period of from about 5 to about 60 seconds.

The negative-working printing plates processed in the practice of this invention typically include a metal or polymeric substrate, as described above for the positive-working plates.

On the substrate is an appropriate negative-working photosensitive layer that includes a photosensitive component, such as a novolac or resole resin, or both. Such materials are well known in the art, as evidenced by the teaching in U.S. Pat. No. 5,372,907 (Haley et al). Further additives can be included in the photosensitive layer composition, including dyes, plasticizers, Bronstad acid precursors, infrared radiation absorbing compounds, sensitizers, stabilizers, surfactants, and components that give printout properties, as are also well known in the art.

One preferred embodiment of this invention is an aqueous alkaline developing composition that is useful in developing either positive-working or negative-working thermal lithographic printing plates, the composition having a pH of from about 12 to about 14 and comprising:

a) potassium silicate in an amount to provide from about 40 to about 60 g $SiO_2$ per 1000 g of composition, and a weight ratio of $SiO_2$ to $K_2O$ of from about 0.7 to about 1.0, and b) from 6 to about 18 weight % of a non-polymeric thickener, such as glycerine.

The following examples are intended to illustrate the practice of this invention, and not to limit it in any way. All percentages are by weight, unless otherwise indicated.

Materials and Methods for Examples

The developing compositions were formulated with a $SiO_2/K_2O$ ratio of 2.1, which ratio could be adjusted by the addition of potassium hydroxide. The amount of $SiO_2$ was adjusted by the addition of water. The Control compositions described in TABLES II and VIII below and the invention compositions described in TABLES III–VIII below, were formulated to have various $SiO_2/K_2O$ ratios of 0.3–1.4, $SiO_2$ concentrations of 20–80 g/1000 g composition, and glycerine or other "thickeners" at concentrations of 0 to 30 weight %.

Each developing composition was sealed in water tight containers and submerged in a temperature controlled (25° C.) water bath to simulate a constant processing temperature. After the composition temperature had equilibrated, a cotton swab was dipped into it, and then lightly wiped across the surface of the imagewise exposed lithographic printing plates (described below). The plates were hand processed to assure constant temperature.

Positive-working printing plates were imagewise exposed to 172 units on a standard exposing frame before development. Thermal negative-working printing plates were imagewise exposed for 110 units, baked at 135° C. in an oven having a baking section 0.6 m long and a conveyor speed of 0.9 m/min before development.

The test object used for exposure contained a conventional UGRA scale to evaluate dot reproduction and resolution, and a T-14 wedge for evaluating relative speed.

Development times were as follows: positive-working plates=20 seconds, negative-working thermal plates=45 seconds. Because the development section of the processor is about 0.3 m in length, a cleanout time of 15 seconds would correspond to a processing speed of 1.3 m/min, a cleanout time of 20 seconds would correspond to a processing speed of 0.9 m/min, and a cleanout time of 60 seconds would correspond to a processing speed of 0.3 m/min. After development, each plate was rinsed and dried in a conventional manner.

The positive-working printing plates used in the examples are commercially available as KODAK PRODUCTION SERIES Printing Plate/Web Publication LRP. The negative-working thermal printing plates used in the examples are commercially available as KODAK DIRECT IMAGE Thermal Printing Plate/830.

Performance of the developer compositions was determined by evaluating processed printing plates for several performance characteristics: Dmax, Dmin, "open step" reproduced on the plate after exposure through a T-14 scale, "solid step" reproduced on the plate after exposure through a T-14 scale, "ghost step" reproduced on the plate after exposure through a T-14 scale, positive microlines, negative microlines and cleanout time.

For the positive-working plates, the following are "acceptable" and "optimal" performance characteristics:

| | |
|---|---|
| Dmax: | Acceptable = 116–122 |
| | Optimal = 117–120 |
| Dmin: | Acceptable = 33 or 34 |
| Open step: | Acceptable = ≧0.5 |
| | Optimal = 2.5 or 3.0 |
| Solid step: | Acceptable = ≦14.5 |
| | Optimal = 4–13 |
| Positive microlines: | Acceptable = 4–6 |
| Negative microlines: | Acceptable = 4–6 |
| Cleanout time: | Acceptable = ≦20 seconds. |

For the negative-working plates, the following are "acceptable" and "optimal" performance characteristics:

| | |
|---|---|
| Dmax: | Acceptable = 95–101 |
| Dmin: | Acceptable = 28–31 |
| Solid step: | Acceptable = ≧0.5 |
| | Optimal = 2.5–13 |
| Ghost step: | Acceptable = ≦14 |
| | Optimal = 6–13 |
| Positive microlines: | Acceptable = 7–10 |
| | Optimal = 4–6 |
| Negative microlines: | Acceptable = 7–10 |
| | Optimal = 4–6 |
| Cleanout time: | Acceptable = ≦60 seconds |
| | Optimal = ≦20 seconds. |

Performance of each developing composition was then evaluated by considering the noted characteristics of each developed plate at four levels:

"optimal performance" (characteristics were in the optimal ranges noted above) was rated a "1", "good performance" (all characteristics but one or two were in optimal ranges and those outside those ranges were close to the limits) was rated a "2", "functional performance" (all characteristics in acceptable ranges, but most outside optimal ranges) was rated a "3", and "poor performance" (most characteristics outside acceptable ranges) was rated a "4".

EXAMPLE 1

Developing Composition

A developer composition of the present invention was prepared by mixing a potassium silicate dispersion (KASIL 2130, 30%, 246.04 g), potassium hydroxide (90%, 51.02 g), glycerine (60 g, 6 weight %) and water to 1000 g. Thus, the ratio of $SiO_2$ to $K_2O$ was 0.80 and the amount of $SiO_2$ g/1000 g of composition was 50.00. KASIL 2130 is a potassium silicate dispersion having a $SiO_2/K_2O$ weight ratio of 2.1, available from PQ Corporation.

The results of processing the positive-working printing plate provided optimal performance except for the positive microlines (a value of "7" instead of the desired upper limit of "6"). Thus, the overall performance was considered "good" or a "2" rating.

The developer composition provided optimal performance with the negative-working thermal printing plate. Thus, the rating for this performance was "1". This can be seen in TABLE III below.

EXAMPLES 2–3
Alternative Developing Compositions

Two alternative developer compositions of the present invention were similarly prepared to contain:

| Component | Example 2 | Example 3 |
|---|---|---|
| Water | 741.29 g | 582.94 g |
| KASIL 2130 | 98.40 g | 246.04 g |
| KOH (90%) | 40.31 g | 51.02 g |
| Glycerine | 120.00 g | 120.00 g |
| % Glycerine | 12% | 12% |
| $SiO_2/K_2O$ ratio | 0.50 | 0.80 |
| $SiO_2$ g/1000 g | 20.00 | 50.00 |

For Example 2, the results from processing the positive-working printing plate demonstrated optimal performance (a rating of "1"). The results from processing the negative-working thermal plate were optimal also except that the cleanout time was 25 seconds ("acceptable"), and thus the overall performance was rated "2". These ratings are listed in TABLE IV below.

The Example 3 composition provided optimal performance with both types of plates (ratings of "1" as seen in TABLE IV below).

EXAMPLE 4
Preferred Developing Composition

A preferred developer composition of the present invention was prepared by mixing KASIL 2130 (30% dispersion, 222.00 g), potassium hydroxide (90% solution, 47.00 g), glycerine (90 g, 9 weight %) and water to 1000 g. Thus, the ratio of $SiO_2$ to $K_2O$ was 0.79 and the amount of $SiO_2$ g/1000 g of composition was 45.12.

The results of processing both the positive-working and negative-working thermal printing plates were optimal performance in all characteristics Thus, the rating for both was "1". TABLE I below shows the actual performance characteristics for example.

TABLE I

| TYPE OF PLATE | PERFORMANCE CHARACTERISTIC | EVALUATION |
|---|---|---|
| Positive-working | Dmax | 117 |
|  | Dmin | 33 |
|  | Open Step | 2.5 |
|  | Solid Step | 13 |
|  | Positive microlines | 6 |
|  | Negative microlines | 4 |
|  | Cleanout time | 8 seconds |
| Negative-working | Dmax | 97 |
|  | Dmin | 30 |
|  | Solid Step | 4.5 |

TABLE I-continued

| TYPE OF PLATE | PERFORMANCE CHARACTERISTIC | EVALUATION |
|---|---|---|
|  | Ghost Step | 8 |
|  | Positive microlines | 4 |
|  | Negative microlines | 7 |
|  | Cleanout time | 19 seconds |

This developing composition was supplied to a processing machine in sufficient quantities to fill the development reservoir (about 19 liters). The same solution was used as the replenisher.

In the first experiment, the positive-working printing plates processed cleanly for an entire cycle of about 278 $m^2$. The strength (activity) of the developing composition at the end of this processing cycle was the same as that at the beginning of the cycle, as measured by sensitometric speeds and rates of cleanout. The plates were then used on a conventional printing press, and visual evaluations confirmed optimal printing performance.

In a second experiment, negative-working thermal printing plates were similarly processed cleanly for the entire cycle. Sufficient strength (activity) was maintained for the entire cycle in the developing composition, to compensate for variations in composition temperature from heating the thermal plates prior to development. A similar developing composition having no glycerine was compared under the same conditions and found to have lost considerable activity at the end of the processing cycle.

EXAMPLE 5
Additional Developing Compositions and Comparisons

Developing compositions were prepared and evaluated as described in the foregoing examples, but having various amounts of glycerine (0%, 6%, 12%, 18% 24% and 30%), $SiO_2$ (20, 50 and 80 g $SiO_2$/1000 g composition) and $SiO_2/K_2O$ ratios (0.3, 0.5, 0.8, 1.1 and 1.4). The "ratings" for these compositions are shown in TABLES II–VII below. The compositions illustrated in TABLE II are Control compositions since they lack a thickener.

It can be seen from the ratings in the TABLES that not all developing compositions provide "optimal" or "good" for each type of printing plate over the entire range of amounts of $SiO_2$. It is apparent, however, that for given amounts of glycerine, "optimal" or "good" performance can be achieved for specific types of printing plates at certain $SiO_2$ amounts and $SiO_2/K_2O$ ratios, which amounts and ratios would be readily determined by routine experimentation.

Still other compositions of the present invention were similarly prepared and evaluated having 9% glycerine. Included was the preferred composition of Example 4 above. All of the compositions provided either "optimal" or "good" performance with both types of printing plates.

TABLE II

| (0% Glycerine) | | | | | | |
|---|---|---|---|---|---|---|
|  | $SiO2$ g/1000 g | | | | | |
|  | 20 | | 50 | | 80 | |
| SiO2/K2O Ratio | Positive Plate | Thermal Plate | Positive Plate | Thermal Plate | Positive Plate | Thermal Plate |
| 0.3 | 4 | 4 | 4 | 4 | 4 | 4 |
| 0.5 | 2 | 1 | 4 | 4 | 4 | 4 |

TABLE II-continued (0% Glycerine)

| | SiO2 g/1000 g | | | | | |
|---|---|---|---|---|---|---|
| | 20 | | 50 | | 80 | |
| SiO2/K2O Ratio | Positive Plate | Thermal Plate | Positive Plate | Thermal Plate | Positive Plate | Thermal Plate |
| 0.8 | 3 | 4 | 2 | 1 | 3 | 3 |
| 1.1 | 4 | 4 | 3 | 4 | 2 | 3 |
| 1.4 | 4 | 4 | 4 | 4 | 4 | 4 |

TABLE III (6% Glycerine)

| | SiO2 g/1000 g | | | | | |
|---|---|---|---|---|---|---|
| | 20 | | 50 | | 80 | |
| SiO2/K2O Ratio | Positive Plate | Thermal Plate | Positive Plate | Thermal Plate | Positive Plate | Thermal Plate |
| 0.3 | 4 | 4 | 4 | 4 | 4 | 4 |
| 0.5 | 1 | 1 | 4 | 4 | 4 | 4 |
| 0.8 | 3 | 4 | 2 | 1 | 3 | 3 |
| 1.1 | 4 | 4 | 3 | 4 | 2 | 4 |
| 1.4 | 4 | 4 | 4 | 4 | 4 | 4 |

TABLE IV (12% Glycerine)

| | SiO2 g/1000 g | | | | | |
|---|---|---|---|---|---|---|
| | 20 | | 50 | | 80 | |
| SiO2/K2O Ratio | Positive Plate | Thermal Plate | Positive Plate | Thermal Plate | Positive Plate | Thermal Plate |
| 0.3 | 4 | 4 | 4 | 4 | 4 | 4 |
| 0.5 | 1 | 2 | 4 | 4 | 4 | 4 |
| 0.8 | 3 | 4 | 1 | 1 | 3 | 2 |
| 1.1 | 4 | 4 | 3 | 4 | 2 | 4 |
| 1.4 | 4 | 4 | 4 | 4 | 4 | 4 |

TABLE V (18% Glycerine)

| | SiO2 g/1000 g | | | | | |
|---|---|---|---|---|---|---|
| | 20 | | 50 | | 80 | |
| SiO2/K2O Ratio | Positive Plate | Thermal Plate | Positive Plate | Thermal Plate | Positive Plate | Thermal Plate |
| 0.3 | 4 | 4 | 4 | 4 | 4 | 4 |
| 0.5 | 1 | 2 | 4 | 4 | 4 | 4 |
| 0.8 | 4 | 4 | 1 | 1 | 3 | 2 |
| 1.1 | 4 | 4 | 3 | 4 | 3 | 4 |
| 1.4 | 4 | 4 | 4 | 4 | 4 | 4 |

TABLE VI (24% Glycerine)

| | SiO2 g/1000 g | | | | | |
|---|---|---|---|---|---|---|
| | 20 | | 50 | | 80 | |
| SiO2/K2O Ratio | Positive Plate | Thermal Plate | Positive Plate | Thermal Plate | Positive Plate | Thermal Plate |
| 0.3 | 4 | 3 | 4 | 4 | 4 | 4 |
| 0.5 | 2 | 2 | 3 | 4 | 4 | 4 |
| 0.8 | 4 | 4 | 2 | 2 | 2 | 2 |
| 1.1 | 4 | 4 | 3 | 4 | 3 | 4 |
| 1.4 | 4 | 4 | 4 | 4 | 4 | 4 |

TABLE VII (30% Glycerine)

| | SiO2 g/1000 g | | | | | |
|---|---|---|---|---|---|---|
| | 20 | | 50 | | 80 | |
| SiO2/K2O Ratio | Positive Plate | Thermal Plate | Positive Plate | Thermal Plate | Positive Plate | Thermal Plate |
| 0.3 | 4 | 3 | 4 | 4 | 4 | 4 |
| 0.5 | 2 | 4 | 4 | 4 | 4 | 4 |
| 0.8 | 3 | 4 | 2 | 2 | 3 | 2 |
| 1.1 | 4 | 4 | 4 | 4 | 3 | 4 |
| 1.4 | 4 | 4 | 4 | 4 | 4 | 4 |

EXAMPLES 6–8

Alternative Thickeners and Comparisons

These examples show the use of three other thickeners in the formulations described above to provide alternative developer compositions of this invention. In addition, several Control compositions that are outside of the present invention are also illustrated. These formulations and the resulting performance characteristics are shown in TABLE VIII below. All formulations contained water (641.00 g), KASIL 2130 (30%, 222.00 g), potassium hydroxide (90% solution, 47.00 g) and thickener (9 weight %, 90 g) for 1000 g of formulation. Thus, the $SiO_2/K_2O$ ratio was 0.80, and the g $SiO_2/1000$ g of composition was 45.12, for each formulation.

The data in TABLE VIII show that the Invention developer compositions containing polyethylene glycol 200 and 600 provided the best performance characteristics with the negative-working thermal plate. The developer composition containing polypropylene glycol 425 may provide better performance characteristics at a different weight % of thickener. The Control compositions provided good to poor performance (ratings of "2" to "4") on both types of printing plates.

TABLE VIII

| | | "Rating" | |
|---|---|---|---|
| Composition | Thickener (9%) | Positive Plate | Thermal Plate |
| Control A | Diethyleneglycol | 4 | 2 |
| Control B | 1,2-Propanediol | 4 | 2 |
| Example 6 | Polyethylene Glycol 200 | 2 | 1 |
| Example 7 | Polyethylene Glycol 600 | 3 | 1 |
| Example 8 | Polypropylene Glycol 425 | 3 | 2 |

TABLE VIII-continued

|  |  | "Rating" | |
| --- | --- | --- | --- |
| Composition | Thickener (9%) | Positive Plate | Thermal Plate |
| Control C | Propylene Glycol 2000 | 2 | 3 |
| Control D | Sugar | 2 | 4 |
| Control E | Sodium salicylate | 2 | 4 |
| Control F | STAR-DRI5* | 2 | 4 |

*STAR-DRI5 is a maltodextrin available from A. E. Staley Mfg. Co.

The invention has been described in detail with particular reference to preferred embodiments thereof, but it will be understood that variations and modifications can be effected within the spirit and scope of the invention.

We claim:

1. A method for providing an image comprising:
    developing an imagewise exposed positive-working lithographic printing plate with an aqueous alkaline developing composition having a pH of from about 12 to about 14 and comprising:
        a) potassium silicate in an amount to provide from about 40 to about 60 g $SiO_2$ per 1000 g of composition, and a weight ratio of $SiO_2$ to $K_2O$ of from about 0.7 to about 1.0, and
        b) from 6 to about 18 weight % of a non-polymeric thickener consisting essentially of glycerine.

2. A method for processing comprising:
    developing an imagewise exposed positive-working lithographic printing plate with an aqueous alkaline developing composition having a pH of at least about 12 and comprising:
        a) an alkali metal silicate, and
        b) at least 6 weight % of glycerine.

3. The method of claim 2 wherein said printing plate comprises a metal or polymeric substrate, having thereon a positive-working photosensitive composition comprising a photosensitive component.

4. The method of claim 2 wherein said printing plate has an aluminum or treated aluminum substrate having thereon a positive-working photosensitive composition, said positive-working photosensitive composition comprising an o-diazonaphthoquinone as the photosensitive component.

5. The method of claim 2 wherein said developing composition has a pH from about 12 to about 14 and contains a hydroxide as a chemical base.

6. The method of claim 2 wherein said alkali metal silicate is present in an amount to provide at least about 20 g $SiO_2$ per 1000 g of composition, and a weight ratio of $SiO_2$ to $M_2O$ of at least about 0.3 wherein M is an alkali metal.

7. The method of claim 6 wherein said alkali metal silicate is present in an amount to provide from about 30 to about 80 g or $SiO_2$ per 1000 g of composition, and a weight ratio of $SiO_2$ to $M_2O$ of from about 0.3 to 1.1.

8. The method of claim 7 wherein said alkali metal silicate is present in an amount to provide from about 40 to about 60 g $SiO_2$ per 1000 g of composition, and a weight ratio of $SiO_2$ to $M_2O$ of from about 0.7 to about 1.0.

9. The method of claim 8 wherein said glycerine is present in an amount of from about 8 to about 12 weight %.

10. The method of claim 2 wherein said glycerine is present in an amount from about 6 to about 30 weight %.

11. The method of claim 10 wherein said glycerine is present in an amount from about 7.5 to about 18 weight %.

12. The method of claim 11 wherein said glycerine is present in an amount from about 8 to about 12 weight %.

13. The method of claim 2 wherein said developing composition further comprises a surfactant, anti-foaming agent, chelating agent or a mixture thereof.

14. The method of claim 2 wherein said alkali metal silicate is potassium silicate.

15. The method of claim 14 wherein said glycerine is present in an amount of from about 8 to about 12 weight %.

* * * * *